United States Patent
Takagi (10) Patent No.: US 7,277,507 B2
(45) Date of Patent: Oct. 2, 2007

(54) VITERBI DECODER

(75) Inventor: Nobuhiro Takagi, Yokosuka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 11 days.

(21) Appl. No.: 10/565,377

(22) PCT Filed: Jul. 26, 2004

(86) PCT No.: PCT/JP2004/010981

§ 371 (c)(1),
(2), (4) Date: Jan. 23, 2006

(87) PCT Pub. No.: WO2005/011129

PCT Pub. Date: Feb. 3, 2005

(65) Prior Publication Data

US 2006/0209995 A1  Sep. 21, 2006

(30) Foreign Application Priority Data

Jul. 25, 2003  (JP)  ............................. 2003-280274

(51) Int. Cl.
*H04L 27/06* (2006.01)
*H03M 13/03* (2006.01)
(52) U.S. Cl. ...................... 375/341; 714/795
(58) Field of Classification Search ............ 375/2, 375/316, 341, 262; 714/786, 787, 794, 795
See application file for complete search history.

(56) References Cited

U.S. PATENT DOCUMENTS 5,446,746 A  8/1995  Park
5,509,021 A  4/1996  Todoroki (Continued)

FOREIGN PATENT DOCUMENTS

| EP | 1017180 | 7/2000 |
|----|---------|--------|
| JP | 5206871 | 8/1993 |
| JP | 5335972 | 12/1993 |
| JP | 8167858 | 6/1996 |
| JP | 9232972 | 9/1997 |
| JP | 10178356 | 6/1998 |
| JP | 1117650 | 1/1999 |
| JP | 1174800 | 3/1999 |
| JP | 200036762 | 2/2000 |

OTHER PUBLICATIONS

PCT International Search Report dated Nov. 9, 2004.
Supplementary European Search Report dated Jun. 22, 2006.

*Primary Examiner*—Tesfaldet Bocure
(74) *Attorney, Agent, or Firm*—Stevens, Davis, Miller & Mosher, LLP (57) ABSTRACT

A Viterbi decoder capable of supporting a variety of constraint lengths and any arbitrary number of coefficients of a given estimated transmission path and composed of special hardware of small circuit scale. In the Viterbi decoder of the present invention, a branch metric calculation section (101) calculates the branch metrics of all paths from the state of the previous time to the state at the present time, selects the most probable path from the paths arriving at respective states based on the branch metrics (101a) and path metrics (103a) and outputs path select signal (102a) and path metric (102b). Path metric storage section (103) outputs path metric (103a) to be input to ACS calculation section (102) when performing ACS calculating at the next time. Path select signal temporary storage section (104) holds path select signal (102a) of n states, outputs path select signal (104a) of m states (m≦n) and changes a bit input position according to the encoding constraint length or the number of coefficient of deduced estimated transmission path of the system which performs Viterbi decoding.

2 Claims, 8 Drawing Sheets

U.S. PATENT DOCUMENTS

| | | | |
|---|---|---|---|
| 5,636,251 A * | 6/1997 | Citta et al. | 375/341 |
| 5,715,470 A * | 2/1998 | Asano et al. | 375/341 |
| 5,742,621 A * | 4/1998 | Amon et al. | 714/792 |
| 5,970,097 A | 10/1999 | Ishikawa et al. | |
| 5,982,822 A | 11/1999 | Hatakeyama | |
| 6,333,954 B1 | 12/2001 | Hansquine | |
| 6,337,890 B1 | 1/2002 | Maru | |
| 6,408,420 B1 | 6/2002 | Todoroki | |
| 6,587,519 B1 * | 7/2003 | Tran et al. | 375/341 |
| 6,904,105 B1 * | 6/2005 | Pugh | 375/341 |
| 2002/0040462 A1 | 4/2002 | Sawaguchi et al. | |

\* cited by examiner

VITERBI DECODER

TECHNICAL FIELD

The present invention relates to a Viterbi decoder adopted in maximum likelihood decoding methods for performing convolutional coding and equalizing processing of received signals.

BACKGROUND ART

Viterbi decoders of this type have high error correction capability and are employed in information communication systems such as decoding apparatus and receiving apparatus for use with transmission schemes for satellite communication and mobile communication where errors are more likely to occur.

Viterbi decoding accomplishes decoding through performing a process of finding the difference (branch metric) between received data sequence and expected data sequence, repeating simple processing (ACS) of addition, comparison and selection, and traceback processing of decoded data finally. With this Viterbi decoding, every time coded data corresponding to one input bit is obtained, the distance between signals of the paths of each state at this time is calculated and remaining paths are found.

For example, when the coding scheme is convolutional coding, Viterbi decoding processing is performed as follows.

The convolutional code is generated from the exclusive logical sum of input bit and preceding a fixed number of bits and a prefixed number of preceding bits, and a plurality of coded data is generated in response to one input bit. The number of input bits (information bits) having influence on this coded data is called constraint length K, and the number is equivalent to the number of stages of shift registers used with exclusive logical sums.

The coded data is defined by the state of input bit and (K−1) preceding input bits. These states shift to new states when new input bit is input. However, whether or not a state can be shifted is determined depending on whether the new input is "0" or "1." The number of states becomes (2K−1) because each of (K−1) bits can be "0" or "1."

In Viterbi decoding, a received coded data sequence is observed and the most probable state is estimated from all possible states. Therefore, in Viterbi decoding, every time coded data corresponding to one input bit is obtained, the distance between signals (metric) of the paths of each state at the time is calculated, and, among paths that reach the same state, the path having the smaller path is left as a remaining path.

Figure 1:
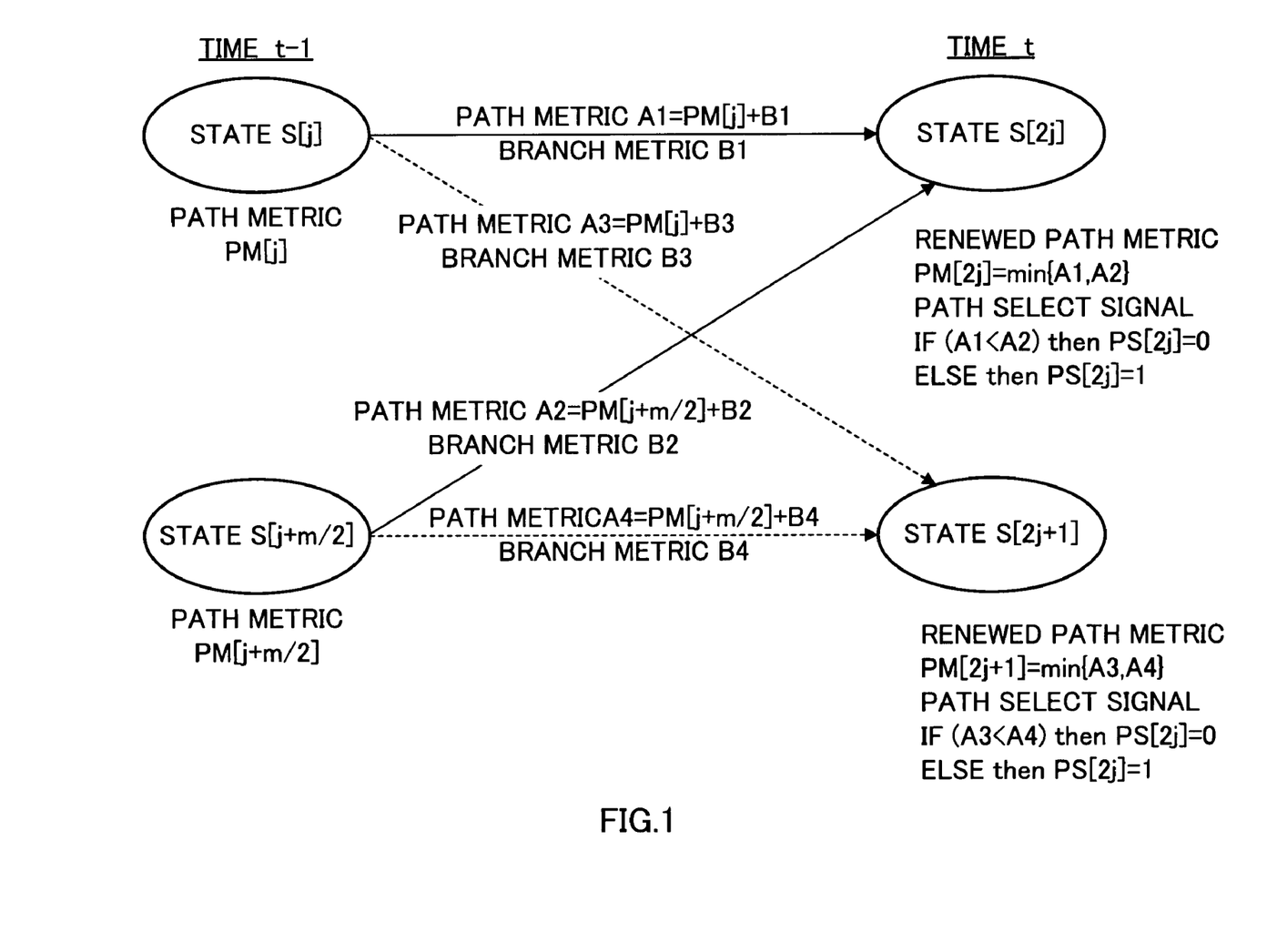
FIG. 1 illustrates a path showing a state change of a code in a Viterbi decoder.

FIG. 1 shows that, in a convolutional encoder with a constraint length K, two paths are expanding respectively, indicating state shift from the state of S[j] and S[j+m/2] at time t−1 of previous time to the state of S[2j] and S[2j+1] at time t. Here, j represents a positive integer number and m represents the number of states.

In FIG. 1, path metric A1 is a sum of the distance between signals (branch metric B1) of expected data sequence and received data sequence that are output when shifting to state S[2j] and path metric PM[j] to state S[j] at previous time.

Likewise, path metric A2 represents a sum of the distance between signals (branch metric B2) of expected data sequence and received data sequence that are output when shifting to state S[2j] and path metric PM[j+m/2] to state S[j+m/2] at previous time.

Thus calculated path metric A1 and A2, which are input to state S[2j], are compared, and the smaller path is selected as a remaining path. Further, the path metric of the selected path is renewed as a path metric until reaching state S[2j] at present time t.

In addition, history of which of path metric A1 and A2 is selected is left as path select signal PS[i] (i=0~2k−1−1). At this time, when the previous state number of the selected path is smaller than the previous state number of the other, unselected path, PS[i] is 0, or is 1 otherwise.

These processes are performed as many times as the number of times of: the number of states multiplied by traceback length. Further, path select signals of: the number of states multiplied by traceback length; and path metrics of the number of states at final time, are obtained. After that, traceback is performed and coded data is decoded with these information.

Figure 2:
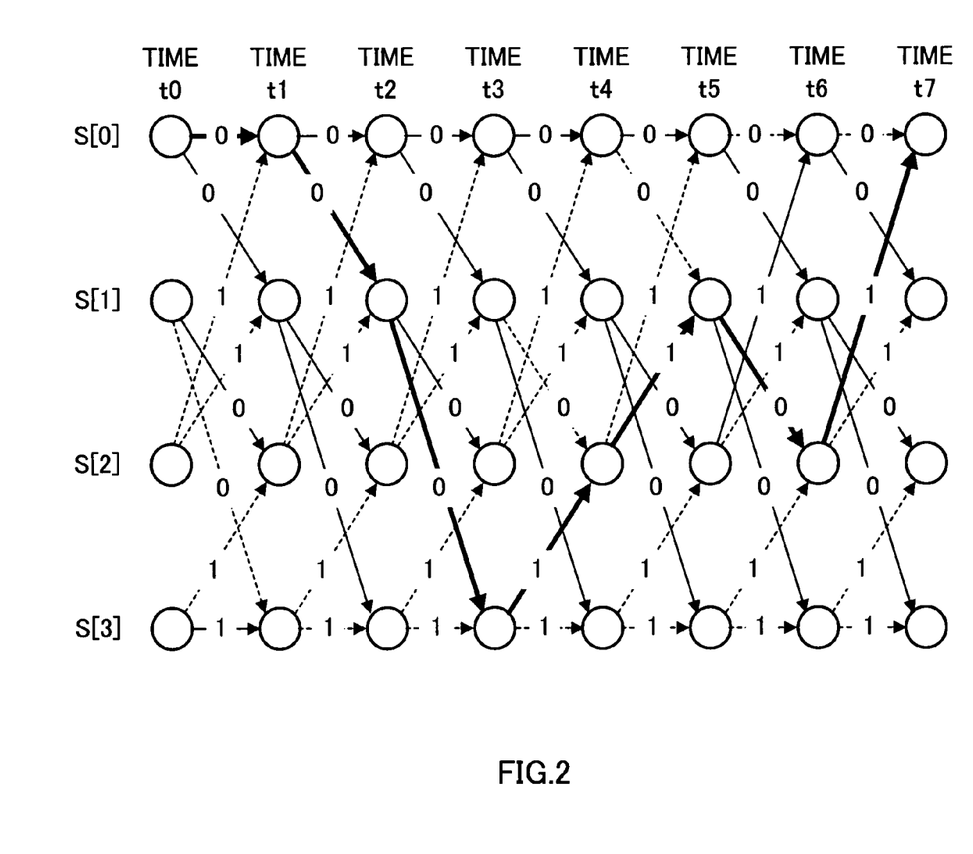
FIG. 2 is a trellis diagram illustrating an example of a state change of a code in a Viterbi decoder.

Next, the traceback processing will be explained briefly with reference to FIG. 2. FIG. 2 is a trellis diagram showing a history of shifting of each state at the time when number of times of processing of the state number multiplied by length, given that constraint length is "3" and traceback length is "7," is finished. Numerical values on the line between states represent path select signals when each state is shifting and path described in a solid line is a remaining path.

In the traceback processing, the path metric of each state at the final time is referred to and the state in which path the metric becomes the smallest is selected. However, when known data sequence is attached to input data sequence of coded data as tail bit, the state indicated by this tail bit is uniquely selected (assuming S[00] is selected in this example). Next, the state goes back to the state one time earlier than the path select signal selected at final time. In addition, the path select signal at this time is output as decoded data. Similarly, subsequently, decoded data of traceback length is output following back the states (the path shown in bold line in FIG. 2) at every unit of time based on the path select signal. This processing makes it possible to decode the decoded data sequence (in this case, 1→0→1→1→0→0→0).

By the way, with this Viterbi decoder, the error correction capability improves as the constraint length becomes larger, and the processing amount increases by increasing the constraint length. Therefore, in conventional information communication systems, a coding scheme having a large constraint length is employed when information source which requires high error correction capability is transmitted, and a coding scheme having a short constraint length is employed when information source which tolerates a certain amount of errors is transmitted. However, with schemes like this, in one information communication system, signals that are coded by a plurality of constraint lengths need to be decoded.

On the other hand, when equalization processing of received signal is performed, it is possible to perform equalization processing with higher accuracy by arbitrarily changing the number of coefficients of the estimated transmission path according to the condition of the transmission path. However, in order to perform equalization processing with high accuracy, the Viterbi decoder needs to be versatile and be able to support any arbitrary number of coefficients of the estimated transmission path.

Especially, in the field of mobile communications adopting the Viterbi decoding method, battery is used as a power source to improve the portability of the communication terminal apparatus, and so reducing power consumption is a material requirement.

For this reason, with conventional Viterbi decoders, dedicated hardware has been used to perform routine processing such as the calculation of branch metric or path metric that does not depend on the constraint length or suchlike for reduced power consumption. In addition, software has been used to perform processing whose processing flow is supposed to change according to constraint length such as coding from path select signal or maximum likelihood decision (for example, see Unexamined Japanese Patent Application Publication No. HEI11-74800).

By the way, in the field of mobile communications, there is demand for expansion of continuous call time of the communication terminal apparatus and reduction of battery capacity for improved portability. It is therefore desirable to provide a Viterbi that supports any arbitrary constraint length and any arbitrary number of coefficients of the estimated transmission path in dedicated hardware configuration requiring little power consumption, to realize a communication terminal apparatus requiring little power consumption, such as described above.

However, with conventional Viterbi decoders, as mentioned earlier, software is used for complex processing; therefore, the problem is that it requires large amount of power and is difficult to fulfill the above-mentioned requirement.

DISCLOSURE OF INVENTION

It is therefore an object of the present invention to provide a Viterbi decoder of high versatility and low power consumption, that can support a variety of constraint lengths and any arbitrary number of coefficients of the estimated transmission path and that can be made in dedicated hardware configuration of small circuit scale.

An essence of the present invention is to temporarily store path select signals over n states, the path select signals being determined depending on which path is selected, and generate decoded data based on path select signals stored sequentially out of the temporarily stored path select signals corresponding to the length of a series of traceback.

According to an embodiment of the present invention, a Viterbi decoder is comprised of a branch metric calculation section calculating branch metric of all the paths from the state at the previous time to the state at the present time, an ACS calculation section outputs a path select signal decided by the selected path that is selected as the most probable path among the paths toward the state at the present time by the branch metrics calculated by the branch metrics calculation section and the given path metric and path metrics needed for arriving at the state at the present time, a path metric storage section storing path metric output from the ACS calculation section, a path select signal temporary storage section storing the path select signal of n states output from the ACS calculation section, a path select signal storage section storing the path select signal of a series of traceback lengths held in the path select signal temporary storage section and a traceback processing section generating decoded data base on the path select signal stored in the path select signal storage section.

BEST MODE FOR CARRYING OUT THE INVENTION

Hereinafter, embodiments of the present invention will be explained in detail with reference to the accompanied drawings.

Figure 3:
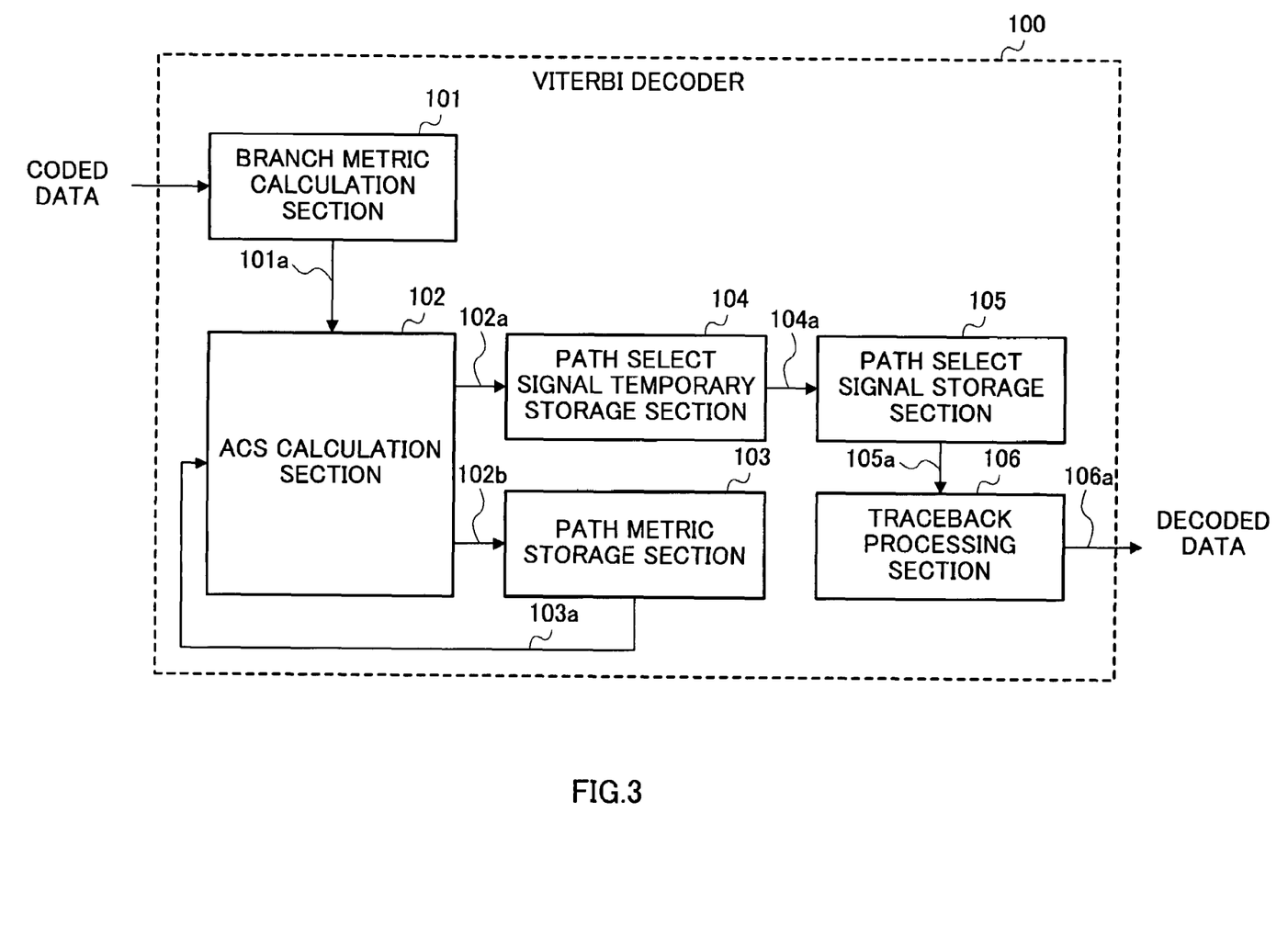
FIG. 3 is a block diagram illustrating a structure of a Viterbi decoder according to an embodiment of the present invention.

FIG. 3 shows Viterbi decoder 100 according to an embodiment of the present invention. This Viterbi decoder 100, as shown in FIG. 3, is provided with: branch metric calculation section 101; ACS calculation section 102; path metric storage section 103; path select signal temporary storage section 104; path select signal storage section 105; and traceback processing section 106.

In FIG. 3, branch metric calculation section 101 calculates the branch metric of all paths from the state at the previous time to the state of the present time with regard to input coded data. Branch metric 101a calculated at branch metric calculation section 101 is output to ACS calculation section 102.

ACS calculation section 102 selects the most probable path from paths toward the respective states with branch metric 101a output from branch metric calculation section 101 and path metric 103a provided from path metric storage section 103. In addition, ACS calculation section 102 outputs path select signal 102a indicating from which state the selected path comes from and path metric signal 102b required to arrive the respective states at present time.

Figure 4:
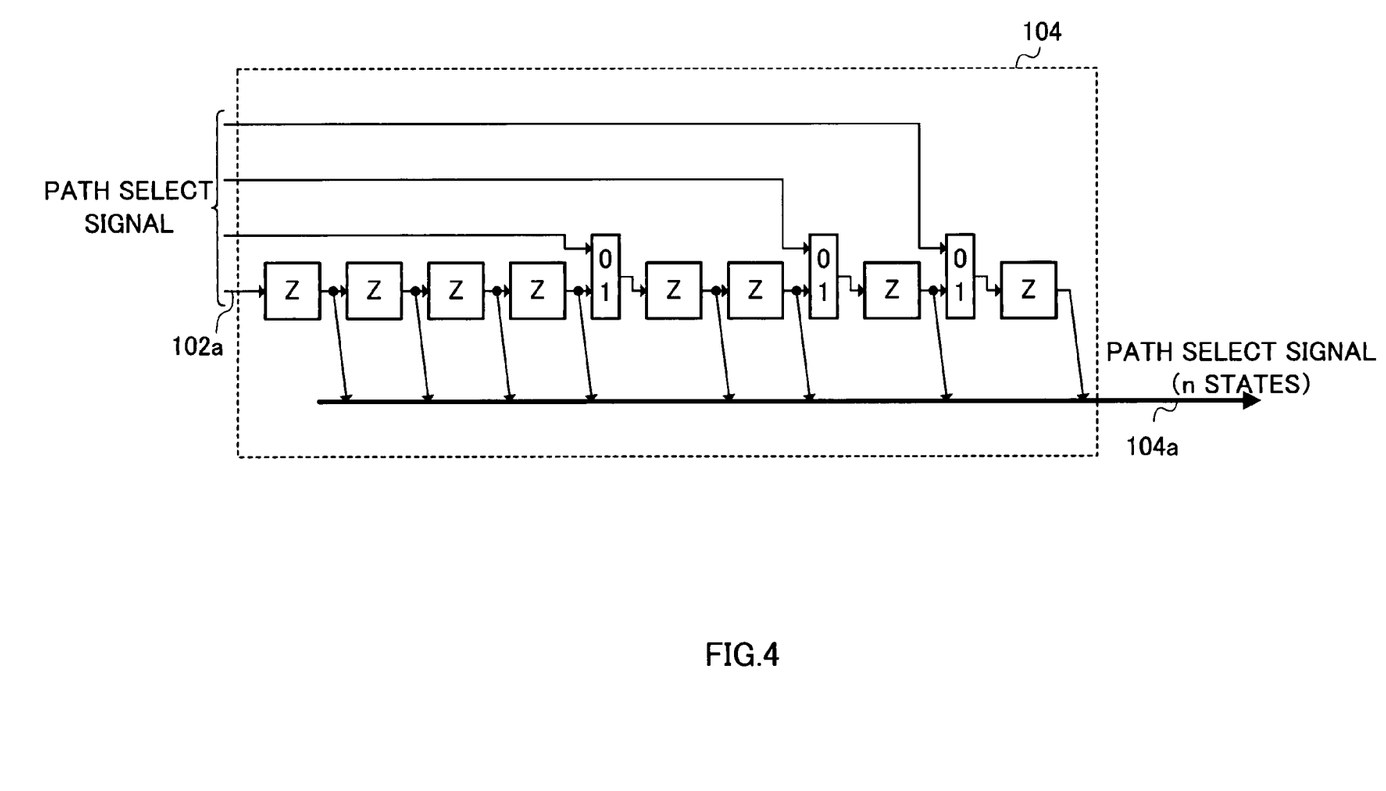
FIG. 4 is a block diagram illustrating a structure of a path select signal temporary storage section in a Viterbi decoder according to an embodiment of the present invention.

Path metric storage section 103 is provided with a memory field storing path metric 102b of the number of states output from ACS calculation section 102 and outputs path metric 103a to be input to ACS calculation section 102 when ACS calculation is performed at the next time. Path select signal temporary storage section 104 stores temporarily path select signals of n states generated in ACS calculation section 102 and, after storing path select signals of the required states, outputs path select signal 104a of m states (m≦n). Path select signal temporary storage section 104, as shown in FIG. 4, is composed of a shift register provided with selector (not illustrated) capable of inputting from predetermined bit positions. The shift register, as path select signal temporary storage section 104, changes the input bit position according to the coding constraint length and the number of coefficients of the estimated transmission path of the system performing Viterbi decoding.

Path select signal temporary storage section 104, shown in FIG. 4, is a shift register storing path select signals of eight states. Path select signal temporary storage section 104 is configured to be able to input path select signals to the respective bit positions of the first, fifth, seventh and eighth as input bit positions from the left side register. For example, when a symbol coded with a generator polynomial of a constraints length of "4" is decoded by Viterbi decoder 100, the number of sates per symbol is eight. Further, these states are set S[0], S[1], . . . , S[7], respectively, and path select signals are input to the first register from the left side of path select signal temporary section 104 in order of generation (S[0], S[1], . . . , S[7]) in ACS calculation section 102.

By this means, for path select signals of one symbol, path select signals of S[0], S[1], . . . , S[7] stored respectively in a register of path select signal temporary storage section 104 in order from the right side register. In addition, when a symbol coded with a generator polynomial of a constraint length of "3" is decoded by Viterbi decoder 100, the number of states per symbol is four. Further, these states are set S[0], S[1], S[2] and S[3], respectively, and path select signals are input to the fifth register from the left side of path select signal temporary section 104 in order of generation (S[0] S[1], S[2] and S[3]) in ACS calculation section 102. By this means, for path select signals of one symbol, this makes select signals S[0], S[1], S[2] and S[3] stored respectively in a register of path select signal temporary storage section 104 in order from the right side register.

In addition, when ACS calculation is performed in parallel, two or more path select signals are generated simultaneously. In this case, a plurality of generated path signals are input simultaneously to several input ports of path select signals temporary storage section 104. This eliminates extra processing cycle for store path select signals and makes it possible to store path select signals in order of predetermined states in a series of registers. For example, assume that a symbol coded with a generator polynomial of a constraint length of "4" is decoded through ACS calculation of both former state and latter state in two parallel sequences. In other words, assume that S[0] and S[4], S[1] and S[5], S[2] and S[6], and S[3] and S[7] output results simultaneously. In this case, path select signals are input simultaneously to the first and fifth registers from the left side of path select signal temporary storage section 104 and, in four cycles, path select signals of S[0], S[1], . . . , S[7] are stored in the register of path select signal temporary storage section 104 from the right side register in order. Likewise, assume that a symbol coded with a generator polynomial of a constraint of length of "3" decoded with ACS calculation of both former state and latter state in two parallel sequences. In other words, assume that S[0] and S[2], S[1] and S[3] output results at the same time. In this case, path select signals are input simultaneously to the fifth and seventh registers from the left side of path select signal temporary storage section 104 and, through two cycles, path select signals of S[0], S[1], S[2] and S[3] are stored in the register of path select signal temporary storage section 104 from the right register in order.

As mentioned above, path select signal temporary storage section 104 is comprised of a shift register capable of inputting from predetermined bit positions and therefore can store path select signal of a fixed state in a fixed bit position regardless of constraint length of coding used this kind of system.

That is, the above-mentioned configuration of path select signal temporary storage section 104 makes it possible to write path select signals in a shift register for path select signals from any arbitrary bit positions according to the constraint length used for coding and the number of coefficients of the estimated transmission path considered for equalization processing. This makes it possible to store path select signals in specific format (for example, in little endian format) in path select signal storage regardless of the constraint length or the number of coefficients of the estimated transmission path. Therefore, the configuration eliminates extra processing according to the constraint length and the number of coefficients of the estimated transmission path and eliminates extra processing by software.

Path select signal 104a of n states taken from path select signal temporary storage section 104 are input collectively or in several times to path select signal storage section 105. Path select signal storage section 105 stores these paths select signals of traceback length as one word unit. Further, path select signal storage section 105 outputs path select signal 105a on a word by word basis with an address designated by control circuit (not illustrated) to traceback processing section 106.

Figure 5:
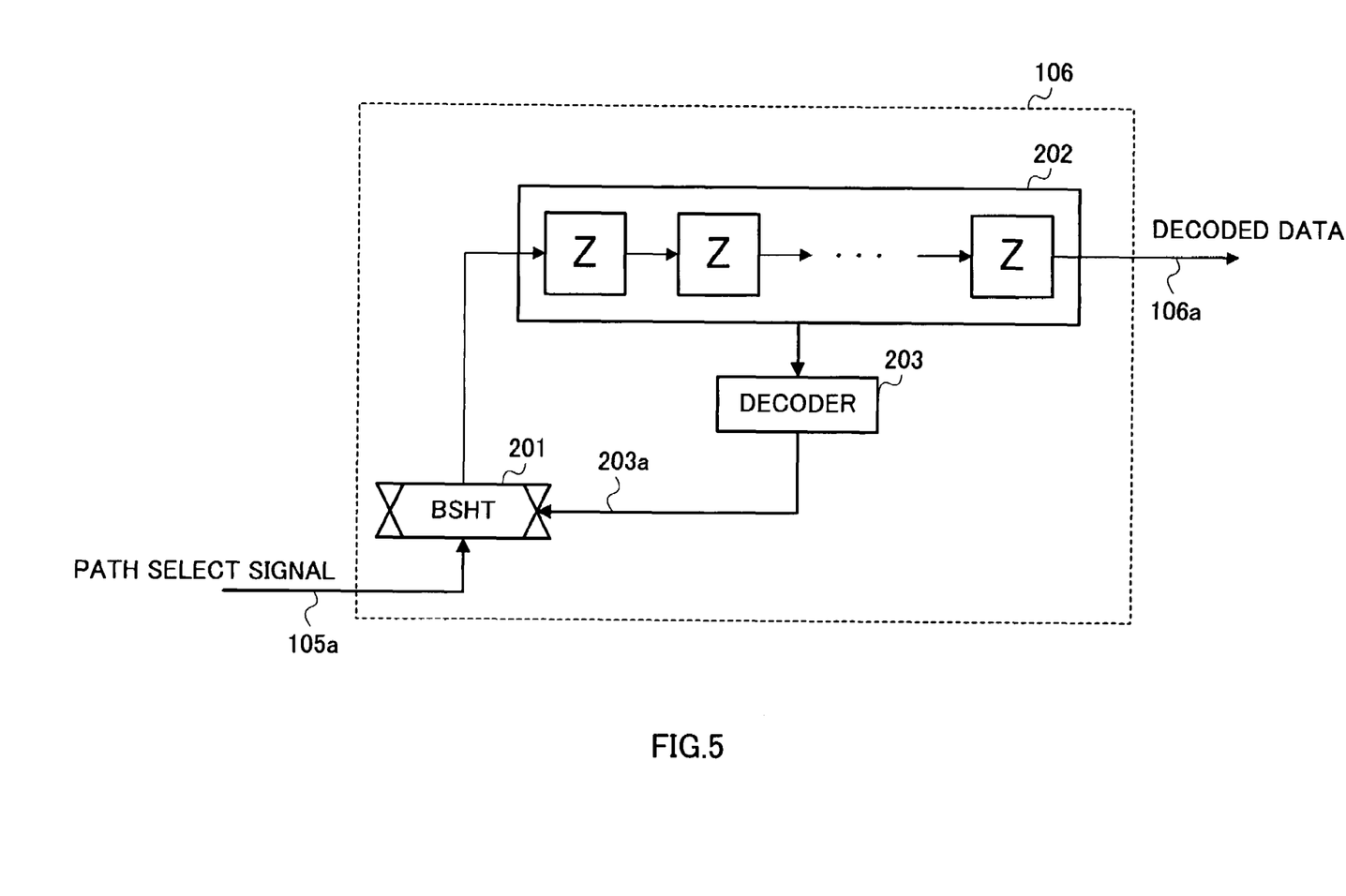
FIG. 5 is a block diagram illustrating a structure of a traceback processing section in a Viterbi decoder according to an embodiment of the present invention.

Traceback processing section 106, as shown in FIG. 5 is provided with barrel shifter (BSHT) 201 for shifting path select signal 105a by one word unit retrieved from path select signal storage section 105. In addition, traceback processing section 106 is provided with data decoding shift register 202 that inputs bits that are shifted to predetermined bit positions by barrel shifter 201, and is also provided with decoder 203 that decodes bit content to predetermined bit positions from input bit position of data decoding shift register 202 corresponding to information of input code.

Traceback processing selects path select signals of one state from path select signals of all states in one received symbol and performs decoding. For this reason, in this traceback processing, the number of states changes depending on the constraint length when performing coding and the number of coefficients of the estimated transmission path when equalization processing is performed.

Traceback processing section 106 generates control signal 203a of barrel shifter 201 to select path select signal of one state from path select signals of all states by decoder 203. That is, traceback processing section 106 is configured such that bit content is decoded from input bit position of data decoding shift register 202 to predetermined bit position according to information of input code by decoder 203. This makes it possible to decode with traceback processing without an extra processing of software when the constraint length or the number of coefficients of the estimated transmission path changes.

In other words, the above-mentioned configuration of traceback processing section 106 makes it possible to take out path select signals of any arbitrary bit positions according to input code information (the constraint length used in coding and the number of coefficients of the estimated transmission path assumed in equalization processing) from path select signals read from the path select signal storage section. In addition, the path select signal taken out can be shifted to data decoding shift register 202. This allows the traceback circuit to be implemented in dedicated hardware supporting any constraint length or any arbitrary number of coefficients of the estimated transmission path.

Next, the operation of Viterbi decoder 100 will be explained with reference to the flow charts shown in FIG. 6 and FIG. 7. Note that the following explanation assumes that the received symbol is coded with convolutional code.

Figure 6:
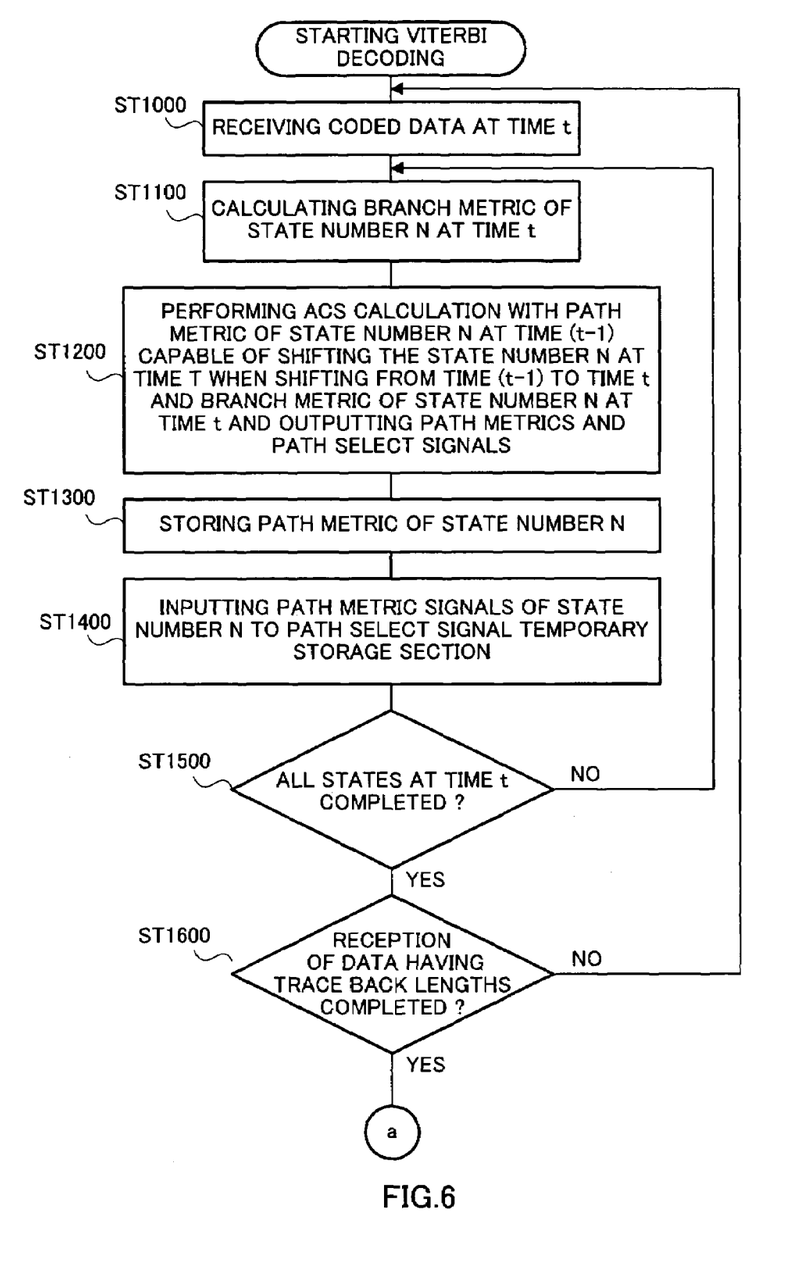
FIG. 6 is a flow chart describing an operation of a Viterbi decoding of a Viterbi decoder according to an embodiment of the present invention.

As shown in FIG. 6, Viterbi decoder 100 receives coded data at time t in step ST1000. The coded data is input to branch metric calculation section 101.

In step ST1100, the Hamming distance or Euclidean distance between expected received value of in state number N and received coded data sequence is calculated and branch metric 101a of state number N at time t is calculated.

Figure 8:
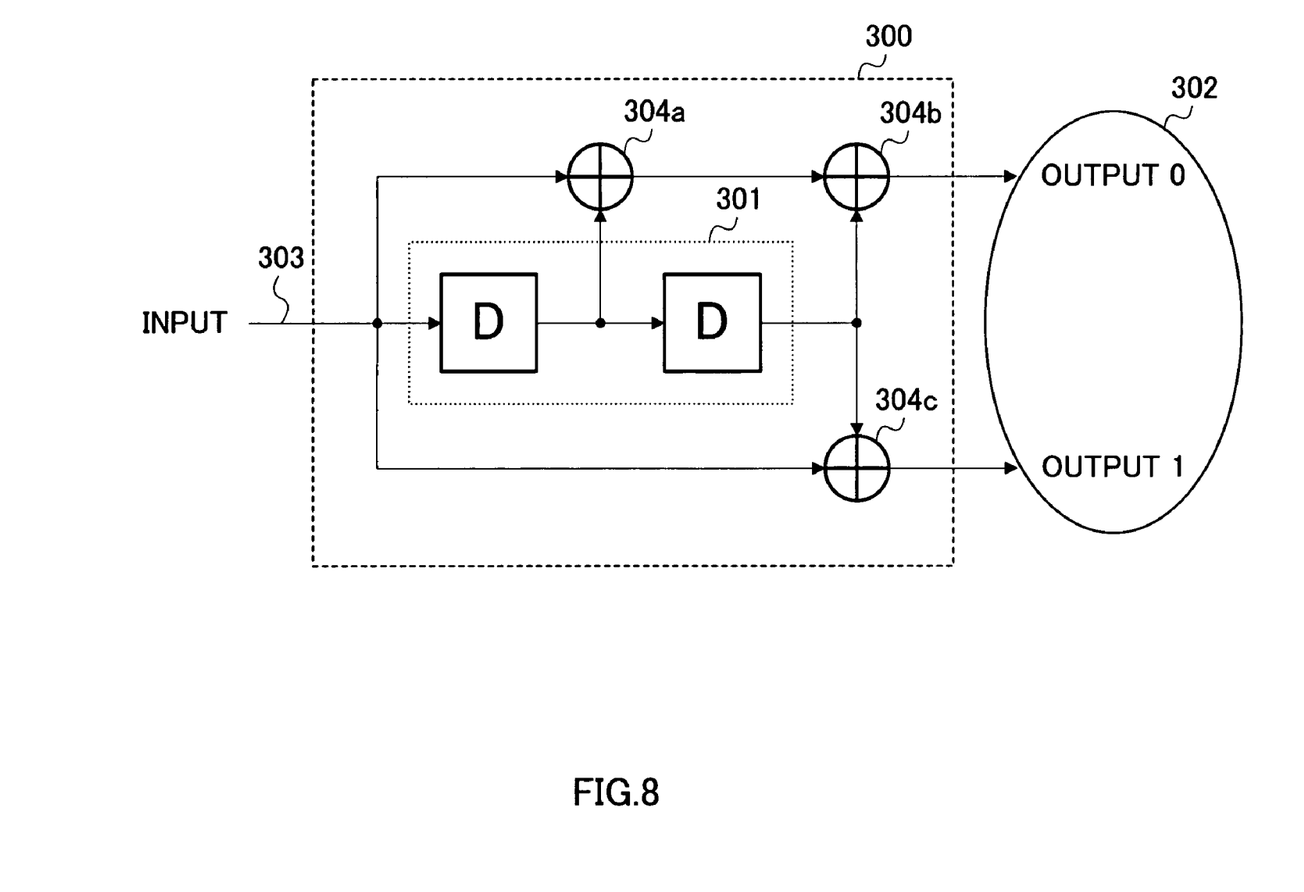
FIG. 8 is a circuit diagram illustrating an example of a decoding circuit with convolutional code system.

When, for example, received coded data is coded by convolutional coder 300 shown in FIG. 8, with the expected received value in state number N, the state number N is determined by the value held in shift register 301 of convolutional coder 300. In addition, coding output sequence 302 is a value which is calculated with a value stored in shift register 301 of convolutional coder 300 and coded input 303 to convolutional coder 300, calculated at exclusive logical sum gates 304a, 304b and 304c. This branch metric calculation generates the received expected value of a plurality of states simultaneously, and therefore it is possible to calculate branch metrics simultaneously when several state numbers and value of coded input 303 toward convolutional coder 300 are different.

In addition, in step ST 1200, butterfly calculation shown in FIG. 1 is performed and ACS calculation is performed. In other words, in step ST1200, ACS calculation is performed, with path metrics of two states at time (t−1) which may be shifted to stat number N at time t when time shifts from time (t−1) to time t and branch metric of state number N at time calculated in step ST1100 and path metric and path select signal are output. Thus, step ST1200 selects remaining path and outputs path select signal 102a indicating the selected path and path metric 102b of state number N at time t. In calculating the path select signal and path metric, having a plural number of ACS calculation section 102 makes it possible to calculate simultaneously for not less than two state numbers.

In addition, in step ST1300, path metric 102b calculated in step ST1200 is stored in path metric storage section 103 as the path metric of state number N at time t.

Further, in step ST1400, the path select signal calculated in step ST1200 is stored in the shift register of path select signal temporary storage section 104. At this time, bit position inputting path select signal to path select signal temporary storage section 104 is changed according to the constraint length when coding is performed. This makes it possible to store path select signals of a fixed state in a fixed bit position regardless of the constraint length of coding used in the system.

Note that the order of step ST1300 and ST1400 can be reversed.

In this case, step ST1500 decides whether or not the process of all states at time t is finished. When the result of decision turns out that the process of all states at time t is finished, the process will proceed to step ST1600, and when the result of decision turns out that the process of all states at time t is not finished, the process from step ST1100 to step ST1400 will be repeated.

Step ST1600 decides whether or not the data of the traceback length has been received. When the result turns out that reception of data with traceback length is completed, next process is performed in step ST1700 and when the result turns out that reception of data with traceback length is not completed, process from step ST1000 to step ST1500 is repeated.

Figure 7:
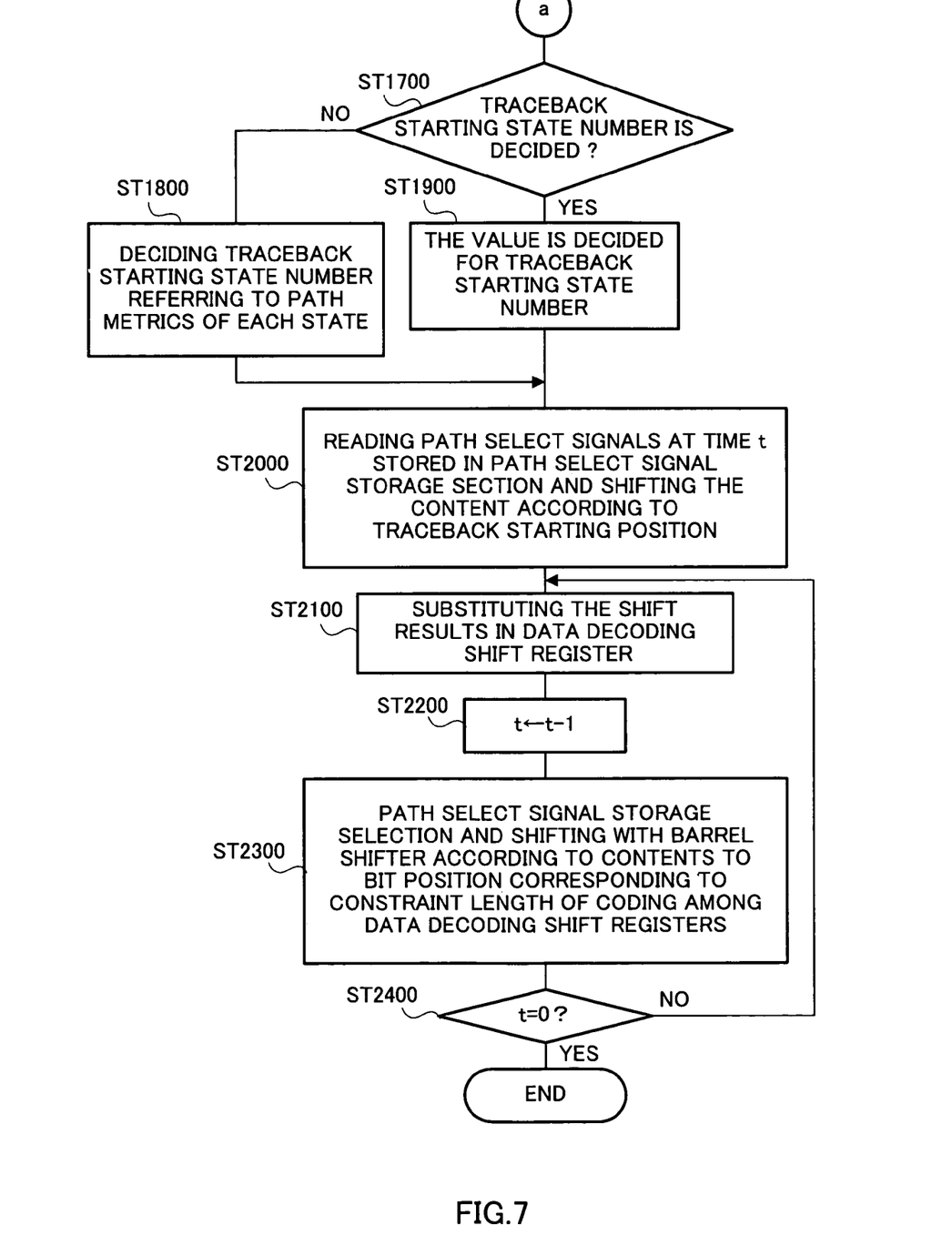
FIG. 7 is a flow chart continuing from FIG. 6.

After that, as shown in FIG. 7, step ST1700 decides whether or not traceback start state number is uniquely decided and, in accordance with the result of the decision, step ST1800 or step ST1900 decide traceback start state number referring to path metric of respective states. That is, when known bits such as tail bit exist in coded data, these bits decide traceback start state number and therefore traceback start state number is decided in step ST1900. On the contrary, when known bits such as tail bit do not exist in coding date, traceback start state number is decided in step ST1800 referring to path metric of each state stored in path metric storage section 103.

In addition, step ST2000 retrieves path select signal at time t stored in path select signal storage section 105 and shifts the content of path select signal according to traceback starting position by barrel shifter 201. That is, path select signal in symbol received at the last time is retrieved from path select signal storage section 105, the content of the path select signal is shifted by barrel shifter 201 according to traceback starting position and bit in a fixed bit position is obtained.

In addition, step ST2100 substitutes the output of barrel shifter 201 (shift result) obtained in step ST2000 in data decoding shift register 202.

Further, step ST2200 returns to one previous time and step ST2300 retrieves path select signal of one time previous to time when previously retrieved path select signal was generated from path select signal storage section 105. This path select signal is shifted by barrel shifter 201 according to content of the path select signal to bit position in proportion to constraint length in data decoding shift register 202. This makes hardware accomplish traceback processing in Viterbi decoding which corresponds to various constraint lengths.

Further, step ST2400 decides whether or not t equals 0. When the result of decision is that t equals 0, above-mentioned series of processing is completed, and when the result of decision is that t does not equal 0, the processing from step ST2100 to step ST2300 is repeated. When traceback processing of all received symbols or symbols of the traceback length are completed, Viterbi decoding is completed.

As described above, embodiments of the present invention make it possible to decode by traceback processing without an extra processing by software although when constraint length and the number of coefficient of estimated transmission path change. In other words, Viterbi decoder can be comprised of special hardware of small circuit scale and lower power consumption can be realized compared to processing performed by conventional DSP.

This application is based on Japanese Patent Application No. 2003-280274, filed on Jul. 25, 2003, the entire content of which is expressly incorporated by reference herein.

INDUSTRIAL APPLICABILITY

A Viterbi decoder according to the present invention provides advantages of supporting a variety of constraint lengths and any arbitrary number of coefficients of the estimated transmission path and can be configured with dedicated hardware of small circuit scale that is versatile and that requires little power consumption, and the Viterbi decoder of the present invention is therefore useful in maximum likelihood decoding method performing convolutional coding and equalization processing of received signals.

The invention claimed is:

1. A Viterbi decoder comprising:
a branch metric calculation section that calculates branch metrics of all paths from a state at a previous time to a state at a present time based on an input code;
an ACS calculation section that selects a most probable path from the paths arriving at respective states at the present time based on the branch metrics calculated by the branch metric calculation section and given path metrics, and outputs a path select signals determined by the selected path and path metrics required to arrive at the state at the present time;

a path metric storage section that stores the path metrics output from the ACS calculation section;

a path select signal temporary storage section that stores the path select signals of n states output from the ACS calculation section;

a path select signal storage section that stores the path select signals stored in the path select signal temporary storage section in order over a length of a series of traceback; and a traceback processing section that generates decoded data based on the path select signals stored in the path select signal storage section, wherein the traceback processing section comprises:

a barrel shifter that shifts path select signals read from the path select signal storage section; and a data decoding shift register that receives as input one bit shifted to a predetermined bit position by the barrel shifter; and wherein the traceback processing section converts content of bits from an input bit position of the data decoding shift register to a predetermined bit position according to the input code information and generates a number of shifts of the path select signals of the barrel shifter.

2. The Viterbi decoder according to claim 1, wherein the path select signal temporary storage section comprises an n bit shift register for path select signals, and the shift register for path select signals receives the path select signals as input from a predetermined bit position.

* * * * *